United States Patent

[11] 3,588,750

[72] Inventor Wolfgang Ulmer
Munich, Germany
[21] Appl. No. 763,031
[22] Filed Sept. 26, 1968
[45] Patented June 28, 1971
[73] Assignee Siemens Aktiengesellschaft
Berlin, Munich, Germany
[32] Priority Sept. 26, 1967
[33] Germany
[31] P 15 91 553.4

[54] QUARTZ-CONTROLLED TRANSISTOR OSCILLATOR

33 Claims, 4 Drawing Figs.

[52] U.S. Cl. .................................................... 332/30V, 331/110, 331/116R, 331/139
[51] Int. Cl. .................................................... H03b 5/38
[50] Field of Search .................................................... 331/110, 116, 138, 139, 158, 36 (C), 177 (V), 332/26, 30, 30 (V)

[56] References Cited

UNITED STATES PATENTS

| | | | |
|---|---|---|---|
| 2,611,873 | 9/1952 | Gager et al. ................. | 331/139 |
| 3,132,310 | 5/1964 | Harrison....................... | 331/116X |
| 3,260,959 | 7/1966 | Broadhead, Jr. ............ | 331/116X |

*Primary Examiner*—Roy Lake
*Assistant Examiner*—Lawrence J. Dahl
*Attorney*—Hill, Sherman, Meroni, Gross and Simpson

ABSTRACT: A quartz-controlled transistor oscillator usable for transmitting and receiving converters of directional radio systems operating in the GigaHertz range wherein a bridge circuit containing the quartz crystal is in circuit between two transistors, and a feedback path between the transistors includes a network shifting the phase in dependence on the oscillating frequency of the quartz.

Patented June 28, 1971 3,588,750

2 Sheets-Sheet 1

INVENTOR
Wolfgang Ulmer

BY Hill, Sherman, Meroni, Gross & Simpson

ATTORNEYS

Patented June 28, 1971 3,588,750

2 Sheets-Sheet 2

INVENTOR
*Wolfgang Ulmer*

BY *Hill, Sherman, Meroni, Gross & Simpson*

ATTORNEYS

QUARTZ-CONTROLLED TRANSISTOR OSCILLATOR

INTRODUCTION TO THE DISCLOSURE

The invention relates to a quartz-controlled transistor oscillator in which the quartz, selectable with respect to its resonance frequency in a broad frequency band, is included for the compensation of its parallel capacitance in a bridge circuit.

In electrical communications and measuring technology and especially in modern directional radio systems there are frequently required closely tolerated frequencies in the GigaHertz range. For example, this holds for the transmitting and receiving converters of directional radio systems. In the modern technique of this type there are now provided mostly oscillators at lower frequencies, for example, in the area of 100 MHz., whose output power is amplified and is multiplied in frequency to the desired transmitting and receiving frequency, for example, by means of varactors. The present striving is to use in the oscillators for these systems semiconductors elements, that is, transistors. Since the demands on such generators with respect to frequency precision are very high, quartz-controlled oscillator circuits are used. In such generators, a frequency change should be practicable as simply as possible, for example, only by change of the quartz crystal.

There are already known circuiting proposals for quartz-controlled transistor oscillators, in which for the compensation of its parallel capacitance, the quartz is placed in a bridge circuit in the feedback branch. Precisely in the above-mentioned area of technology, however, the known simple circuits of this type do not meet the stringent requirements which are necessary for directional radio systems, for example, with respect to phase noise and with respect to frequency precision being temperature dependent. Besides there exist in such system the requirements of being able to balance (compensate) the changes of the quartz frequency brought about by aging in a simple manner by so-called "pulling" (Ziehen) of the quartz frequency, and also of modulating the quartz oscillator in frequency with as great and as linear as possible a stroke. The last point is determinative above all for the transmission of conversation channels in directional radio systems.

Underlying the invention is the problem of providing a quartz oscillator of the type described at the outset which largely meets the requirements enumerated.

This problem is solved according to the invention in a quartz-controlled transistor oscillator in which the quartz, selectable with respect to its resonance frequency in a wide frequency band, is included, for the compensation of its parallel capacitance, in a bridge circuit, and the bridge circuit containing the quartz is arranged between two transistors, and in which the output of the second transistor is connected for the feedback with the input of the first transistor over a network rotating the phase in dependence on the oscillating frequency of the quartz, with largely constant phase rotation in the whole wide operating frequency range of the oscillator.

The bridge circuit consists here advantageously of a transformer which is fed on its primary side from the first transistor and, on its secondary side, delivers two counterphased voltages which are fed to two bridge branches, of which the one is formed by the quartz itself, and the other by a compensation capacitance for the quartz parallel capacitance. Advantageously the outputs of the two bridge branches are connected with one another and led to the primary side of a second transformer whose secondary side feeds the second transistor.

In this circuit execution it is advantageous if the compensation capacitance and the quartz are each bridged over with an inductance and that the parallel resonance circuits thereby formed are tune to the mean operating frequency of the oscillator.

It is further advantageous if the second transformer together with its stray capacitance forms a parallel resonance circuit tuned to the mean operating frequency of the oscillator.

For the controlling of the second transistor (which is arranged in the circuit after the quartz) with as high as possible an oscillating current of the quartz frequency it is advantageous to impart to the second transformer in this circuit a great current translation ratio, so that the oscillating quartz itself is burdened only with a smaller oscillating current than that supplied to the following transistor.

It is further advantageous if the compensation capacitance is chosen much smaller than the capacitance of the quartz and that the translation ratio of the first transformer is correspondingly chosen in such a way that the bridge equilibrium remains preserved.

Further expediently, the stray inductance, kept as small as possible, of the second transformer and the infeed inductance up to the input of the second transistor is supplemented through an interposed series capacitance to provide a series resonance circuit tuned to the mean operating frequency of the oscillator.

A further advantageous feature of the invention consists in that the second transistor is operated in base circuit and that its emitter current is adjusted in such a way that the admissible oscillating current of the quartz is not exceeded, and that, further, by the introduction of a resistor into its emitter feed, its input effective resistance is maintained in the positive range.

It is further advantageous if in the feedback line in connection to the second transistor, there is placed first of all an attenuating resistor and, in connection thereupon, the phase rotating network.

A further advantageous feature of the invention consists in that the phase rotating (phase shifting) network consists of a bridge transformer, preferably in "economy" circuit (operating as an autotransformer), with one terminal of the bridge circuit located at one side of the primary winding and connected to the feedback line through a resistor, and with an opposite terminal of the bridge circuit connected through a parallel resonance circuit to the feedback line, the secondary side of the transformer being connected to the first transistor, in which system the parallel resonance circuit is adjusted in such a way that the necessary phase rotation is achieved in the feedback path. For the temperature compensation of the circuit-caused frequency changes it is advantageous that a suitable temperature-dependent resistor be engaged in parallel to the resistor.

Advantageously there is engaged parallel to the first transistor operated in emitter circuit an attenuating resistor on output side, preferably with interposition of a series resonance circuit tuned to the mean operating frequency of the oscillator.

Especially in the last-mentioned form of the circuit according to the invention it is advantageous if for the frequency modulation of the oscillator the capacitance of the parallel resonance circuit situated in the feedback path is replaced at least in part by a capacitance diode controlled in its capacitance by the modulation signals.

For the control of a transistor amplifier engaged after the transistor oscillator it is advantageous to connect in circuit a transformer on output side of the second transistor of the oscillator. In the feedline from this transformer to the transistor amplifier there will advantageously be placed a damped series resonance circuit tuned to the middle of the operating frequency range of the oscillator.

DESCRIPTION OF THE PREFERRED EMBODIMENT

Below, with the aid of FIGS. 1 to 3, the circuit according to the invention with ITS advantages is explained in detail.

Figure 1:
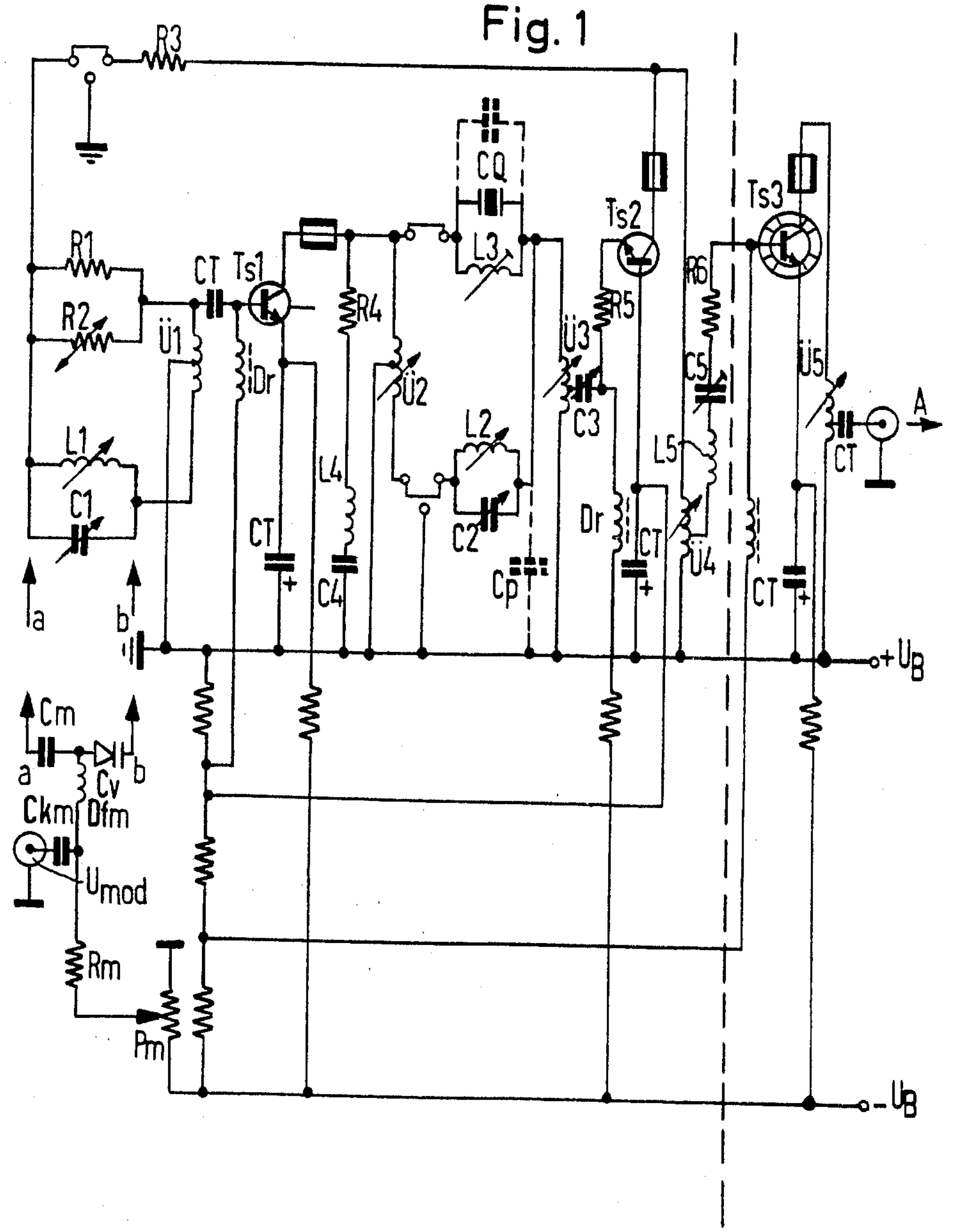
FIG. 1 is a circuit diagram of an embodiment according to the present invention.

FIG. 1 shows the circuit diagram of an example of execution of the quartz oscillator according to the invention. The transistors Ts1 and Ts2 form the actual oscillator, Ts3 serves only for the further amplification-decoupling without retroaction (regeneration), of the oscillator power over a transformer U5. Essential to the invention is the network between Ts1 and Ts2. The quartz is installed in an asymmetrical bridge circuit which is followed by a strongly transforming transformer U3. The stray inductance of U3 and of the circuit is completed by C3 into a series circuit. The main inductance of U3 forms with stray capacitance $C_p$; the inductance L3 forms with quartz parallel capacitance CQ; and in the other bridge branch L2 forms with C2, in each case, a parallel circuit. All these circuits are tuned to the middle of the desired frequency range.

Further essential is the use of the phase shifting circuit U1, L1, C1, R1 in the feedback path of the quartz oscillator. The condition for this phase shifter is rotation of the phase in as broad as possible a frequency range without change of amplitude. The "Thernewid" R2 serves for temperature compensation of the circuit-conditioned frequency changes of the quartz oscillator. R3 is an attenuation resistor in the feedback line. In the collector circuits of the transistors there are located in a known manner damping beads for the avoidance of higher frequency oscillations. The chokes Dr and other construction elements not designated in detail serve purposes of current conduction and decoupling according to a known manner. The capacitors CT form short circuits for the operating frequencies.

The bridge circuit has the purpose of compensating the parallel capacitance CQ of the quartz over a broad band, so that over as wide as possible a frequency band a great attenuation is achieved outside the actual quartz resonance.

It is possible to lay out the entire feedback path in wideband form, without there existing the danger that the oscillator will oscillate at a frequency other than the resonance frequency of the quartz. This great bandwidth is important in order to achieve in the feedback loop as small as possible a frequency-dependent phase alteration or group running time (envelope delay) ($d\Phi/d\omega$) in the desired frequency range. This, in turn, brings it about that by only the changing of the quartz it is possible to change the oscillator frequency. In this system, furthermore, quartzes start oscillating with certainty even when the resonance frequency lies relatively far remote from the band center established by the tuning of the oscillator circuit. Furthermore, quartz frequencies lying remote from the middle of the band are drawn only slightly toward the band center, i.e., the oscillation frequency that is realized in the oscillator operation differs only little from the series resonance frequency establishable in a two-pole measurement of the quartz and, namely, the former lies somewhat nearer to the middle of the band than the latter. A further improvement of the frequency-dependent phase change in the feedback path is obtained by insertion of the series resonance circuits L4, C4 and/or L5, C5 with the attenuation resistors R4, R6. These series resonance circuits have their resonance at the band center frequency and are connected in circuit in such a way that they reduce the frequency-dependent phase change in a certain range about the band center frequency (thus serving as "phase turnback members").

The phase noise of the quartz oscillators is kept low mainly through three measures:

1. The network between Ts1 and Ts2 is designed in such a way that it acts as a quartz filter with very small bandwidth. The noise of the transistor Ts1 is blocked thereby except for constituents which become active at very low base band frequencies. The phase noise at low frequencies, however, can be considerably greater than at high base band frequencies, since in frequency-modulated systems the signal phase stroke at low frequencies is relatively great and thereby the signal-to-noise ratio is great. The decoupling of the transistor Ts1 over the feedback resistor R3 is so great that here, too, Ts1 has virtually no influence on the noise of the oscillator, which is thereby caused mainly by Ts2.

2. Through the transistor Ts2 there should flow as great as possible a signal current. Since through the quartz there may flow only a certain maximal oscillation current (generally a power of a few milliwatts should not be exceeded), this oscillation current is enlarged in a transformer U3 with large current translation ratio.

3. The transistor Ts2 should be fed on the input side from an internal resistance which remains high-ohmic over as great as possible a bandwidth, with the exception of the narrow range about the quartz resonance proper, since the noise current in the transistor Ts2 is all the less, the greater the resistance is between emitter and base. This is achieved by the means that (*a*) the stray inductance of the transformer U3 and (*b*) the stray capacitance $C_p$ of U3 and the circuit are made as small as possible, (*c*) the quartz parallel capacitance CQ and the bridge capacitance C2 are compensated in the middle of the band, and (*d*) that the bridge circuit is made asymmetrical so that C2 becomes small with respect to CQ.

Figure 2:
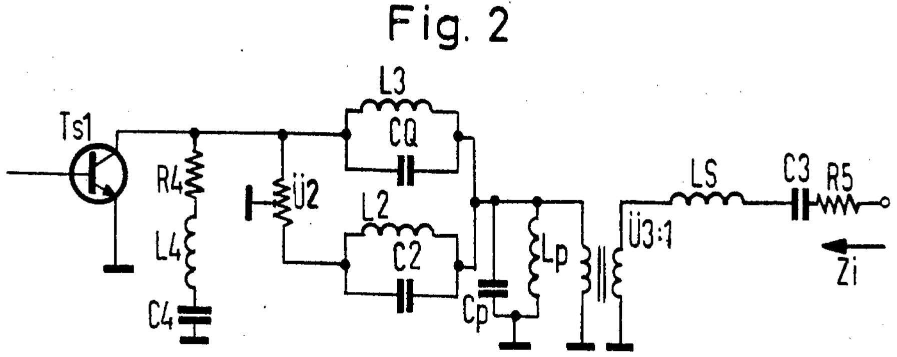
FIG. 2 shows a simplified representation of a portion of the circuit of FIG. 1, facilitating an analysis of its operation.

The bridge circuit mentioned can be replaced by the simplified circuit diagram represented in FIG. 2. After the transistor Ts1 there follows the already mentioned resonance circuit with the elements R4, L4, C4, which lies parallel to the transistor Ts1 for high frequencies, between the emitter and the collector. Parallel to this there lies, in turn, the primary side of the transformer U2. On the secondary side of this there lies, on the one hand, the bridge branch with the quartz, formed by the parallel resonance circuit of L3 and CQ and the quartz impedances proper Rq, Cq and Lq. The other side of the transformer is represented unchanged with respect to FIG. 1. The two parallel circuits lead to the primary winding of the transformer U3. As already mentioned, the main inductance Lp of the transformer U3 together with the stray capacitance $C_p$ of the circuit forms against ground a parallel resonance circuit which is tuned to the middle of the desired frequency range. The transformer U3 itself is represented in this equivalent circuit diagram as a so-called "ideal transformer" with separate windings; its translation ratio may be represented as (U3): 1. To the secondary side of this transformer there is connected the already mentioned series resonance circuit consisting of the stray inductance LS of the circuit and of the transformer U3, the capacitance C3 and the resistor R5. So that the phase noise of the quartz oscillator will be as small as possible, it is important that the output resistance indicated by $Zi$ of this network be high-ohmic in as great as possible a frequency range about the quartz frequency.

Figure 3:
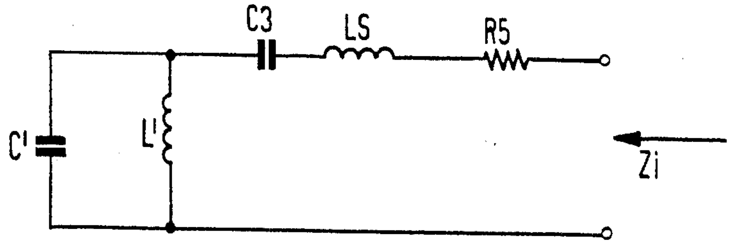
FIG. 3 shows a simplification of the circuit of FIG. 2 for the purpose of analyzing the output impedance of the circuit.

With neglect of the quartz resonance proper $Lq$, $Cq$, $Rq$, it is possible to set up for this output resistor $Zi$ the equivalent circuit diagram drawn in FIG. 3.

In this equivalent circuit diagram the individual magnitudes have the following values:

$$L'=\frac{1}{(U3)^2}\cdot\frac{1}{\frac{1}{LP}+\frac{1}{L2}+\frac{1}{L3}} \quad (1)$$

and $$C'=(U3)^2\cdot(Cp+C2+CQ) \quad (2)$$

LS is the sum of the stray inductance of the transformer $U3$ and the feed inductance of $C3$ and $R5$.

Since $$\omega_o^2=\frac{1}{L3\cdot CQ}=\frac{1}{L2\cdot C2}=\frac{1}{C_p\cdot L_p}=\frac{1}{LS\cdot C3} \quad (3)$$

there holds for $Zi$ the equation $$Zi=R5+j\omega_o LS\left(\frac{\omega}{\omega_o}-\frac{\omega_o}{\omega}\right)+\frac{1}{j\omega_o C'\left(\frac{\omega}{\omega_o}-\frac{\omega_o}{\omega}\right)} \quad (4)$$

$f_o=\frac{\omega_o}{2\pi}$ is the band middle frequency.

For $\omega=\omega_o$ $Zi \to \infty$, i.e., in the middle of the band $Zi$ is high-ohmic.

On both sides of the band middle there occur series resonances and, namely, when $Zi=R5$.

If there is assumed $\frac{\omega}{\omega_o}=\Omega$; then from (4) with $Zi=R5$:

$$\omega_o LS\left(\Omega-\frac{1}{\Omega}\right)-\frac{1}{\omega_o C'}\cdot\frac{1}{\Omega-\frac{1}{\Omega}}=0 \quad (5)$$

$$\left(\Omega-\frac{1}{\Omega}\right)^2=\frac{1}{\omega_o^2 LS\cdot C'} \quad (6)$$

and with low relative frequency deviations $\Delta f/f_o$ and where $\omega=\omega_o+\Delta\omega$, there holds, approximately $$\Omega-\frac{1}{\Omega}=\frac{2\Delta f}{f_o}=\frac{2\Delta\omega}{\omega_o} \quad (7)$$

$$(2\Delta\Omega)^2=\frac{1}{LS\cdot C'} \quad (8)$$

The frequency spacing of the series resonances to the band middle, accordingly is $$\Delta f=\frac{1}{4\pi\sqrt{LS\cdot C'}} \quad (9)$$

or from (2)

$$\Delta f=\frac{1}{4\pi U3\sqrt{LS(C_p+C2+CQ)}} \quad (10)$$

i.e., $\Delta f$ is all the greater, the smaller LS, $C_p$, C2 and CQ are.

R5 is very small (a few ohms) and serves the purpose of bringing the input resistance of the transistor T*s*2, which can become negative through regeneration, to a positive value, so that no undesired self-excitation of T*s*2 occurs. Above and below the band middle frequency $f_o$ the feed resistance presents a series resonance. At these frequencies the transistor T*s*2 is fed from a very small internal resistance and the noise performance given off rises sharply. It is important, therefore, that these series resonances have as great as possible a frequency distance from the middle frequency. This distance is, with good approximation, $$\Delta f=\frac{1}{2}f_o\sqrt{\frac{C3}{(U3)^2(CQ+C2+C_p)}}=\frac{1}{4\pi\sqrt{(U3)^2LS(CQ+C2+C_p)}} \quad (11)$$

The translation ratio of U3 is expediently determined according to the following viewpoints:

a. the signal current should be as great as possible;

b. the quartz should be closed off with not too great a resistance. (This is explained in detail in a later passage with the aid of FIG. 4).

LS is given by the unavoidable stray inductance of U3 and of the circuit construction and should be kept as small as possible. CQ is firmly prescribed by the quartz, likewise $C_p$ is determined by the construction of the supporting bracket of the quartz (for example a conductive plate) and the unavoidable stray capacitances from the coil and the circuit. Through the asymmetrical construction of the bridge circuit there is now gained the advantage that C2 can be reduced in correspondence to the translation ratio of the bridge transformer U2. Thereby it is possible to make the frequency distance $\Delta f$ so great that the noise of the transistor T*s*2 is sufficiently low in the whole frequency range.

Figure 4:
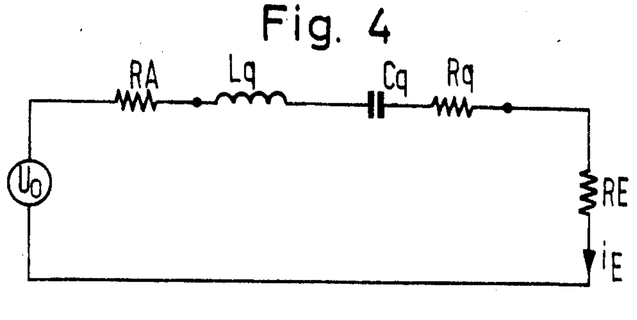
FIG. 4 shows a simplified circuit for representing the operation of the circuit of FIG. 1 in the vicinity of series resonance of the quartz.

The above-mentioned influence of the resistances on the pulling (Ziehen) of the quartz is now explained in detail with the aid of FIG. 4.

In the vicinity of the series resonance of the quartz the quartz, namely, can be replaced approximately by the circuit diagram represented in FIG. 4. RA is in this circuit the internal resistance from which the quartz is fed and RE is the sum of R5 and the input resistance of T*s*2 transformed to the primary side of U3. U*o* is the source voltage of T*s*1 and *i*E is the current flowing in U3. If the phase position of the feedback voltage U*o* at the frequency $\omega q=\frac{1}{\sqrt{LqCq}}$ is precisely 0°, then the oscillator oscillates at the frequency *fq*. If the phase position is not 0°, then the oscillation state of the quartz circuit will be untuned to such an extent that in the whole feedback path the phase is again 0°. The phase displacement between the initial voltage U*o* (of T*s*1) and the input current *i*E (of T*s*2) can be calculated as follows:

$$\frac{Uo}{iE}=RA+Rq+RE+j\omega qLq\left(\frac{\omega}{\omega q}-\frac{\omega q}{\omega}\right) \quad (12)$$

and with $RA+Rq+RE=R_{total}$;

$$Qq=\frac{\omega qLq}{Rq},\ \frac{R_{total}}{Rq}=\beta \quad (13)$$

and the approximation valid for small relative frequency deviations $$\frac{\omega}{\omega q}-\frac{\omega q}{\omega}=\frac{2(f-fq)}{fq}=\frac{2\Delta f}{fq} \quad (14)$$

there results $$\frac{Uo}{iE}=Rq\left(\beta+jQq\frac{2\Delta f}{fq}\right) \quad (15)$$

and the phase angle between iE and Uo $$tg\vartheta=-\frac{Qq}{\beta}\cdot\frac{2\Delta f}{fq} \quad (16)$$

If it is assumed that with the phase shifter there is possible a phase alteration of ± 45°, then there results, with a quartz quality of $50\cdot10^3$ (50,000) and a ratio $$\frac{R_{total}}{Rq}=\beta=2$$

a pulling range of $$\frac{\Delta f}{fq}=\pm20\cdot10^{-6}(\pm20/1{,}000{,}000)$$

It is perceived, therefore, than an enlargement of $R_{total}$ on the one hand improves the pulling possibility, but on the other hand, the circuit-caused influence on the frequency precision (temperature course, aging of transistors and construction parts) also becomes greater.

The phase shifter consists of the transformer U1, the inductance L1, the capacitor C1 and the resistor R1, and has the advantage that the phase condition for self-excitation, namely $\Phi=0$, can set in over a large angular range, without appreciable alteration of the amplification, in the feedback path. The input side of the phase shifter is high-ohmic (ideally, input resistance would be $=\infty$), while the transformer is to transform to the low-ohmic transistor input of T*s*l, so that there is offered for this virtually a source resistance $Ri=0$.

Through insertion of a temperature-dependent resistor such as a "Thernewid" R2 it is possible in a simple manner to compensate for the temperature-dependent frequency changes of the quartz oscillator caused through the circuit. A further advantage lies in that in a simple manner there can be achieved a frequency modulation of the quartz oscillator by replacing C1 by a capacitance diode and superimposing on its direct bias voltage the alternating voltage which is to modulate the oscillator frequency. Through the great bandwidth of the total oscillator circuit it is thus possible to generate a relatively large and linear frequency stroke for quartz oscillators.

A circuit example for this is presented in more detail in FIG. 1, left, below. This circuit portion is placed with its terminals *a*, *b* b on the corresponding designated terminals of the inductance L1, and, namely, in place of the variable capacitor C1. The essential element in this circuit is the capacitance diode C*v*, which is biased in the required manner through the potentiometer P*m* over the decoupling elements resistor R*m* and choke D*fm* by means of a direct voltage ($-U_B$). Parallel to this there is fed in over the capacitor C*km* a modulating voltage $U_{mod}$. The blocking capacitor $C_m$ serves for the prevention of a short circuit for the bias voltages of the capacitance diode C*u*.

A further advantage of the oscillator circuit according to the invention lies in that the oscillation current in the quartz is largely independent of the series loss resistance of the quartz and the amplification in the feedback path. The emitter current of T*s*2 is adjusted in such a way that in the quartz there is achieved precisely the desired oscillation current. The transistor T*s*2 acts virtually as a current limiter for the oscillation current of the quartz. Simultaneously there is achieved thereby also a favorable ratio of signal current to noise current in the transistor T*s*2. Since the noise current rises as the emitter current increases, it is of advantage if the signal current is made so great that it is limited on the transistor current. A limitation on the collector saturation voltage is avoided through suitable choice of the collector voltage and of the collector load resistance, since otherwise the noise properties are considerably impaired.

I claim:

1. A crystal-controlled transistor oscillator in which the crystal, selectable with respect to its resonance frequency over a substantial frequency range, is included in a bridge circuit which serves for the compensation of the parallel capacitance of the crystal, characterized in that the bridge circuit containing said crystal is connected in circuit between first and second transistors, the output of the second transistor having a feedback path for transmitting feedback current therefrom to said first transistor to create an oscillatory condition, said feedback path connecting with the input of the first transistor via a phase shifting network interposed in said feedback path, means comprising said bridge circuit and said feedback path with said phase shifting network interposed therein for establishing oscillation substantially at the resonance frequency of said crystal for any selected crystal having a resonance frequency within said substantial frequency range, said oscillator being further characterized in that the bridge circuit consists of a transformer which is fed on its primary side from the first transistor and on its secondary side delivers two counterphased voltages, which are supplied to two bridge branches, of which the one is formed by the crystal itself, and the other by a compensation capacitance for the crystal parallel capacitance, said two bridge branches being in turn connected with the input of said second transistor.

2. A transistor oscillator according to claim 1, characterized in that the outputs of the two bridge branches are connected with one another and are conducted to the primary side of a second transformer whose secondary side feeds the second transistor.

3. A transistor oscillator according to claim 1, characterized in that the compensation capacitance and the crystal are each bridged over with an inductance and that the parallel resonance circuits thereby formed are tuned to the mean operating frequency of the oscillator.

4. A transistor oscillator according to claim 2, characterized in that the second transformer together with its stray capacitance forms a parallel resonance circuit tuned to the mean operating frequency of the oscillator.

5. A transistor oscillator according to claim 2, characterized in that the second transformer has a current translation ratio of such magnitude that the oscillation current through the second transistor at the crystal frequency is considerably greater than the oscillation current in the crystal itself.

6. A transistor oscillator according to claim 1, characterized in that the compensation capacitance is chosen much smaller than the capacitance of the crystal, and that the translation ratio of the first transformer is correspondingly chosen in such a way that the bridge equilibrium remains preserved.

7. A transistor oscillator according to claim 2, characterized in that the stray inductance, kept as small as possible, of the second transformer and the infeed inductance up to the input electrode of the second transistor is supplemented by an interposed series capacitance to form a series resonance circuit tuned to the mean operating frequency of the oscillator.

8. A transistor oscillator according to claim 1, characterized in that the phase shifting network consists of a bridge transformer whose primary winding has one terminal connected via a resistor to the feedback path and has another terminal connected via a parallel resonance circuit to the feedback path, and whose secondary side is connected to the first transistor, the parallel resonance circuit being adjusted in such a way that the necessary phase rotation for oscillation is achieved in the feedback path.

9. A transistor oscillator according to claim 8, characterized in that the resistor has connected parallel to it a temperature-dependent resistor suited for the temperature compensation of the circuit-conditioned frequency changes.

10. A transistor oscillator according to claim 8, characterized in that parallel to the first transistor operated in the emitter circuit there is connected a damping resistor, and a series resonance circuit tuned to the mean operating frequency of the oscillator.

11. A transistor oscillator according to claim 8, characterized in that for the frequency modulation of the oscillator, the capacitance of the parallel resonance circuit situated in the feedback path is constituted at least in part by a capacitance diode controlled in its capacitance by the modulating signal.

12. A transistor oscillator according to claim 1, characterized in that the second transistor contains at its output side a third transformer which feeds a third transistor for providing power amplification, and further characterized in that the signal feedline of the third transistor includes a damped series resonance circuit tuned to the middle of said substantial frequency range of the oscillator.

13. A transistor oscillator according to claim 2, characterized in that the compensation capacitance and the crystal are each bridged over with an inductance and that the parallel resonance circuits thereby formed are tuned to the mean operating frequency of the oscillator.

14. A transistor oscillator according to claim 2, characterized in that the compensation capacitance is chosen much smaller that the capacitance of the crystal, and that the translation ratio of the first transformer is correspondingly chosen in such a way that the bridge equilibrium remains preserved.

15. A transistor oscillator according to claim 3, characterized in that a compensation capacitance is chosen much smaller than the capacitance of the crystal, and that the translation ratio of the first transformer is corresponding chosen in such a way that the bridge equilibrium remains preserved.

16. A transistor oscillator according to claim 9, characterized in that parallel to the first transistor operated in the emitter circuit there is connected a damping resistor, and a series resonance circuit tuned to the mean operating frequency of the oscillator.

17. A transistor oscillator according to claim 9, characterized in that for the frequency modulation of the oscillator, the capacitance of the parallel resonance circuit situated in the feedback path is constituted at least in part by a capacitance diode controlled in its capacitance by the modulating signal.

18. A transistor oscillator according to claim 10, characterized in that for the frequency modulation of the oscillator, the capacitance of the parallel resonance circuit situated in the feedback path is constituted at least in part by a capacitance diode controlled in its capacitance by the modulating signal.

19. A crystal-controlled transistor oscillator in which the crystal, selectable with respect to its resonance frequency within a broad frequency band, is included in a bridge circuit in order to compensate for the parallel capacitance of the crystal, characterized by the fact that the bridge circuit containing the crystal is inserted between first and second transistors and comprises a transformer which, on its primary side, is fed from the first transistor, and supplies on the secondary side two counterphased voltages which are supplied to two bridge branches of said bridge circuit, one bridge branch being formed by the crystal itself and the other bridge branch being formed by a compensation capacitance which serves to compensate for the parallel capacitance of the crystal, the two bridge branches being connected in common to the primary side of a second transformer whose secondary side supplies the second transistor, and that furthermore, the output of the second transistor has a feedback path connected with the input of the first transistor via an adjustable phase shifting network, which shifts the phase of the feedback current within a broad frequency band without substantially changing the feedback amplitude to establish oscillation substantially at the resonance frequency of the crystal.

20. A transistor oscillator according to claim 19, characterized by the fact that the compensation capacitance and the crystal each are bridged with an inductance and the parallel resonance circuits formed thereby are tuned to the mean operating frequency of the oscillator.

21. A transistor oscillator according to claim 19, characterized by the fact that the second transformer together with its leakage capacitance forms a resonance circuit tuned to the mean operating frequency of the oscillator.

22. A transistor oscillator according to claim 20, characterized by the fact that the second transformer together with its leakage capacitance forms a resonance circuit tuned to the mean operating frequency of the oscillator.

23. A transistor oscillator according to claim 19, characterized by the fact that the second transformer shows such a high current translation ratio as to transform the oscillation current of the crystal to substantially a maximum input current to the second transistor.

24. A transistor oscillator according to claim 19, characterized by the fact that the bridge circuit is designed asymmetrically because the compensation capacitance has been selected smaller than the parallel capacitance of the crystal.

25. A transistor oscillator according to claim 19, characterized by the fact that the leakage inductance—kept substantially at a minumum value—of the second transformer and the lead-in inductance up to the input electrode of the second transistor are, by means of a series capacitance placed in between, completed into a series resonance circuit tuned to the mean operating frequency of the oscillator.

26. A transistor oscillator according to claim 19, characterized by the fact that the second transistor is operated in the common base mode and that its emitter current is adjusted in such a way that the admissible oscillating current of the crystal is not exceeded and that furthermore the input resistance of the second transistor is kept in the positive range by means of a resistance in the emitter line of the second transistor.

27. A transistor oscillator according to claim 19, characterized by the fact that in the feedback path connected with the second transistor there is placed first a damping resistance and then the phase shifting network.

28. A transistor oscillator according to claim 19, characterized by the fact that the phase shifting network consists of a bridge transformer with one terminal of the primary winding thereof connected with a resistance and whose other terminal is connected to a parallel resonance circuit, the resistance and the parallel resonance circuit being connected in common to the feedback path, and the secondary side of the bridge transformer being connected to the first transistor, the parallel resonance circuit being adjusted in such a way as to establish oscillation substantially at the resonance frequency of the crystal.

29. A transistor oscillator according to claim 28, characterized by the fact that parallel to the first-mentioned resistance is a temperature-dependent resistance providing for the temperature compensation of the circuit-conditioned frequency changes.

30. A transistor oscillator according to claim 28, characterized by the fact that parallel to the first transistor, which is operated in common emitter mode, there is connected a damping resistor, and a series resonance circuit tuned to the mean operating frequency of the oscillator.

31. A transistor oscillator according to claim 28, characterized by the fact that for the frequency modulation of the oscillator, the capacitance of the parallel resonance circuit situated in the feedback path is constituted at least in part by a capacitance diode controlled in its capacitance by the modulating signal.

32. A transistor oscillator according to claim 19, characterized by the fact that the second transistor is connected at its output side with a third transformer which feeds a third transistor for providing power amplification.

33. A transistor oscillator according to claim 32, characterized by the fact that a dampened series resonance circuit tuned to the operating frequency range of the oscillator is disposed in the signal input line of the third transistor.